United States Patent
Takamiya

(10) Patent No.: US 11,374,552 B2
(45) Date of Patent: Jun. 28, 2022

(54) MULTIPLEXER, RADIO-FREQUENCY FRONT-END CIRCUIT, AND COMMUNICATION DEVICE

(71) Applicant: Murata Manufacturing Co., Ltd., Nagaokakyo (JP)

(72) Inventor: Miki Takamiya, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 428 days.

(21) Appl. No.: 16/666,571

(22) Filed: Oct. 29, 2019

(65) Prior Publication Data

US 2020/0067488 A1 Feb. 27, 2020

Related U.S. Application Data

(63) Continuation of application No. PCT/JP2018/018019, filed on May 9, 2018.

(30) Foreign Application Priority Data

May 15, 2017 (JP) .............................. JP2017-096566

(51) Int. Cl.
*H03H 9/64* (2006.01)
*H03F 3/19* (2006.01)
(Continued)

(52) U.S. Cl.
CPC .............. *H03H 9/6489* (2013.01); *H03F 3/19* (2013.01); *H03H 9/145* (2013.01); *H03H 9/72* (2013.01);
(Continued)

(58) Field of Classification Search
CPC ........ H03H 9/6496; H03H 9/145; H03H 9/72; H03F 3/19; H03F 2200/451; H04B 1/0067; H04J 1/10
See application file for complete search history.

(56) References Cited

U.S. PATENT DOCUMENTS

| 2008/0150652 A1 | 6/2008 | Itou |
| 2012/0218052 A1 | 8/2012 | Tsurunari et al. |

(Continued)

FOREIGN PATENT DOCUMENTS

| JP | 2008-160562 A | 7/2008 |
| JP | 2013-081068 A | 5/2013 |

(Continued)

OTHER PUBLICATIONS

Official Communication issued in Japanese Patent Application No. 2019-519198, dated Jan. 14, 2020.

(Continued)

*Primary Examiner* — Elton Williams
(74) *Attorney, Agent, or Firm* — Keating & Bennett, LLP

(57) ABSTRACT

A multiplexer includes a filter located between a common terminal and an individual terminal, and a filter that is located between the common terminal and an individual terminal and that has a pass band whose frequency is lower than the pass band of the filter. The filter includes serial arm resonators provided on the first path connecting the common terminal to the individual terminal. Each of the serial arm resonators includes a piezoelectric substrate and an IDT electrode which use leaky waves as principal acoustic waves. The occurrence frequency of the Rayleigh wave response of the serial arm resonator is different from that of the serial arm resonator.

17 Claims, 7 Drawing Sheets

(51) Int. Cl.
*H03H 9/145* (2006.01)
*H03H 9/72* (2006.01)
*H04B 1/00* (2006.01)
*H04J 1/10* (2006.01)

(52) U.S. Cl.
CPC .............. *H04B 1/0067* (2013.01); *H04J 1/10* (2013.01); *H03F 2200/451* (2013.01)

(56) References Cited

U.S. PATENT DOCUMENTS

| | | | |
|---|---|---|---|
| 2016/0118956 A1* | 4/2016 | Kihara | H03H 9/25 333/195 |
| 2017/0093371 A1 | 3/2017 | Takamine | |
| 2017/0272057 A1 | 9/2017 | Takata | |
| 2017/0294897 A1 | 10/2017 | Kanazawa et al. | |
| 2018/0123556 A1 | 5/2018 | Takamine | |
| 2018/0138890 A1* | 5/2018 | Kubat | H03H 9/02228 |

FOREIGN PATENT DOCUMENTS

| | | |
|---|---|---|
| JP | 2016-136712 A | 7/2016 |
| WO | 2011/102128 A1 | 8/2011 |
| WO | 2015/198904 A1 | 12/2015 |
| WO | 2016/088680 A1 | 6/2016 |
| WO | 2016/111262 A1 | 7/2016 |
| WO | 2016/208447 A1 | 12/2016 |

OTHER PUBLICATIONS

Official Communication issued in International Patent Application No. PCT/JP2018/018019, dated Jun. 19, 2018.

* cited by examiner

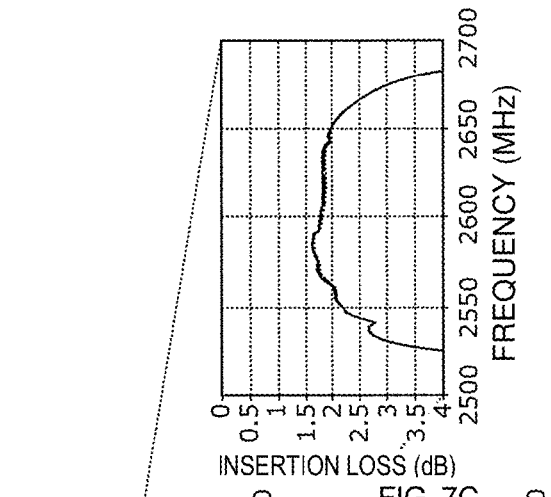
FIG. 7B
FIG. 7C
FIG. 7E
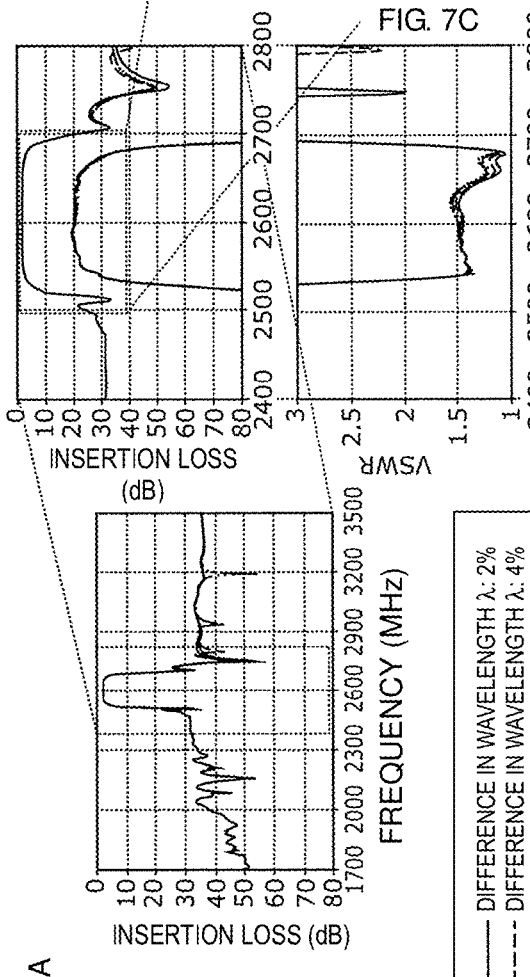
FIG. 7A
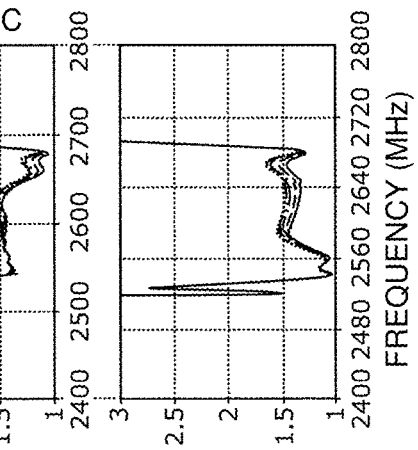
FIG. 7D

MULTIPLEXER, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-096566 filed on May 15, 2017 and is a Continuation Application of PCT Application No. PCT/JP2018/018019 filed on May 9, 2018. The entire contents of each application are hereby incorporated herein by reference.

BACKGROUND OF THE INVENTION

1. Field of the Invention

The present invention relates to a multiplexer, a radio-frequency front-end circuit, and a communication device.

2. Description of the Related Art

In recent years, to be compatible with a technique of using multiple frequency bands and multiple wireless systems in a single terminal, that is, a technique for multi-band and multi-mode, communication devices such as cellular phone terminals have used a multiplexer (branching filter) that separates (branches) a radio frequency signal into frequency bands.

Japanese Unexamined Patent Application Publication No. 2013-81068 discloses a one-chip leaky acoustic wave branching filter in which a ladder bandpass filter and a multimode-coupled bandpass filter are connected to a common point.

However, as in Japanese Unexamined Patent Application Publication No. 2013-81068, a bandpass filter, which is included in a branching filter and which uses leaky waves as principal acoustic waves, has a problem about the Rayleigh wave responses of the acoustic-wave resonators. That is, assume that multiple bandpass filters are connected to a common point as described above. The Rayleigh wave responses, which are produced in the pass band of a different bandpass filter, of the acoustic-wave resonators in a bandpass filter cause a problem of occurrence of a ripple in the pass band of the different bandpass filter and degradation of the insertion loss of the different bandpass filter.

SUMMARY OF THE INVENTION

Preferred embodiments of the present invention provide multiplexers, radio-frequency front-end circuits, and communication devices which are each able to significantly reduce or prevent degradation of the insertion loss in the pass band which is caused by the Rayleigh wave responses of acoustic-wave resonators.

A multiplexer according to a preferred embodiment of the present invention includes a common terminal, a first terminal, a second terminal, a first filter, and a second filter. The first filter is located between the common terminal and the first terminal. The second filter is located between the common terminal and the second terminal, and has a pass band whose frequency is lower than a pass band of the first filter. The first filter includes at least a first serial arm resonator and a second serial arm resonator which are provided on a first path connecting the common terminal to the first terminal. Each of the first serial arm resonator and the second serial arm resonator includes a piezoelectric substrate and an IDT electrode which use a leaky wave as a principal acoustic wave. An occurrence frequency of a Rayleigh wave response of the first serial arm resonator is different from an occurrence frequency of a Rayleigh wave response of the second serial arm resonator.

In a multiplexer having a configuration in which a first filter that uses leaky waves as principal acoustic waves is connected to a second filter through a common terminal, the Rayleigh wave responses (Rayleigh-wave spurious responses) of the serial arm resonators included in the first filter are produced in a frequency range lower than the pass band of the first filter. In this case, the reflection coefficient in the lower frequency range, which is observed when the first filter is viewed from the common terminal, degrades (decreases). Thus, when the lower frequency range is included in the pass band of the second filter, a ripple caused by the Rayleigh wave responses is produced in the pass band of the second filter. The ripple causes degradation of the insertion loss in the pass band of the second filter.

In contrast, according to the configuration described above, the occurrence frequency of the Rayleigh wave response of the first serial arm resonator included in the first filter is different from that of the second serial arm resonator, so as to achieve frequency-distribution of the Rayleigh-wave spurious responses produced in the frequency range lower than the pass band of the first filter. This avoids the occurrence of the state in which the Rayleigh wave responses, concentrated at a specific frequency, are produced by multiple serial arm resonators and produce an accumulated response, and achieves a reduction in the magnitude of the Rayleigh-wave spurious response. Accordingly, the magnitude of a ripple, which is produced in the pass band of the second filter and which is caused by the Rayleigh wave response, may be reduced, so as to achieve a reduction of the insertion loss in the pass band of the second filter.

A first IDT wavelength may be different from a second IDT wavelength by about 2% or greater of the second IDT wavelength. The first IDT wavelength is defined by a repeated pitch of a plurality of electrode fingers included in the IDT electrode of the first serial arm resonator. The second IDT wavelength is defined by a repeated pitch of a plurality of electrode fingers included in the IDT electrode of the second serial arm resonator.

Adjusting the IDT wavelength of a serial arm resonator causes the occurrence frequency of the Rayleigh wave response as well as the resonant frequency of the serial arm resonator to change.

The configuration described above indicates that the IDT wavelength of the first serial arm resonator included in the first filter is different from that of the second serial arm resonator by about 2% or greater, and achieves frequency-distribution of the Rayleigh-wave spurious responses produced in the frequency range lower than the pass band of the first filter. The difference of about 2% or greater between the occurrence frequency of the Rayleigh wave response of the first serial arm resonator and that of the second serial arm resonator is able to provide the occurrence frequency of the Rayleigh wave response of the first serial arm resonator or the second serial arm resonator to be located outside the pass band of the second filter. Thus, the magnitude of the Rayleigh-wave spurious response in the pass band of the second filter may be reduced, so as to achieve a reduction of the insertion loss in the pass band of the second filter.

A difference between the first IDT wavelength and the second IDT wavelength with respect to the second IDT wavelength is $D\lambda$ (%), a frequency difference, which is DR (%) with respect to a center frequency of the first filter, is provided between the occurrence frequency of the Rayleigh wave response of the first serial arm resonator and the occurrence frequency of the Rayleigh wave response of the second serial arm resonator. In this case, in the multiplexer in which a band width ratio of the second filter is X2(%), a difference Dλx (%) between the first IDT wavelength and the second IDT wavelength with respect to the second IDT wavelength may satisfy a relationship, Dλx (%)≥(X2/DR)× Dλ.

Adjusting the IDT wavelength of a serial arm resonator causes the occurrence frequency of the Rayleigh wave response as well as the resonant frequency of the serial arm resonator to change. When, in the first filter, the difference between the first IDT wavelength and the second IDT wavelength is made by Dλ (%), the frequency difference between the occurrence frequencies of the Rayleigh wave responses is DR (%). In this case, to locate the Rayleigh wave responses of the first serial arm resonator and the second serial arm resonator in frequency ranges lower and higher than the pass band of the second filter having a band width ratio of X2(%), the difference Dλx (%) between the first IDT wavelength and the second IDT wavelength satisfies the relationship indicated by the expression described above. Accordingly, the occurrence frequencies of the Rayleigh wave responses of the first serial arm resonator and the second serial arm resonator are able to be located outside the pass band of the second filter. Thus, Rayleigh-wave spurious responses in the pass band of the second filter may be eliminated, so as to achieve a reduction of the insertion loss in the pass band of the second filter.

When the difference between the first IDT wavelength and the second IDT wavelength with respect to the second IDT wavelength is about 2%, the frequency difference, which is about 1.47% with respect to the center frequency of the first filter, is provided between the occurrence frequency of the Rayleigh wave response of the first serial arm resonator and the occurrence frequency of the Rayleigh wave response of the second serial arm resonator. In the multiplexer in which the band width ratio of the second filter is about 2.93%, the difference between the first IDT wavelength and the second IDT wavelength with respect to the second IDT wavelength may be equal to or greater than about 4%.

Accordingly, the occurrence frequencies of the Rayleigh wave responses of the first serial arm resonator and the second serial arm resonator are able to be located outside the pass band of the second filter. Thus, for example, if the second filter is compatible with Band 1 of LTE having a band width ratio of about 2.93%, the Rayleigh-wave spurious responses in the pass band may be eliminated, so as to achieve a reduction of the insertion loss in the pass band of the second filter.

The first filter may further include a third serial arm resonator provided on the first path. The third serial arm resonator may include a piezoelectric substrate and an IDT electrode which uses a leaky wave as a principal acoustic wave. The occurrence frequency of the Rayleigh wave response of the first serial arm resonator may be different from an occurrence frequency of a Rayleigh wave response of the third serial arm resonator. The first serial arm resonator may be connected closest to the common terminal among the first serial arm resonator, the second serial arm resonator, and the third serial arm resonator.

In the first filter including multiple serial arm resonators, the reflection coefficient observed when the first filter is viewed from the common terminal is dominated by the reflection coefficient of the serial arm resonator closest to the common terminal among the multiple serial arm resonators.

In the configuration described above, the occurrence frequency of the Rayleigh wave response of the first serial arm resonator is different from (does not match) the occurrence frequencies of the Rayleigh wave responses of the second serial arm resonator and the third serial arm resonator. Thus, according to the configuration described above, the reflection coefficient at the occurrence frequency of the Rayleigh wave response of the first serial arm resonator is able to be made larger than the reflection coefficients at the occurrence frequencies of the Rayleigh wave responses of the second serial arm resonator and the third serial arm resonator. Further, the first serial arm resonator is closer to the common terminal than the second serial arm resonator and the third serial arm resonator. Thus, the reflection coefficients at the occurrence frequencies of the Rayleigh wave responses of the second serial arm resonator and the third serial arm resonator may be made relatively larger. Accordingly, a ripple, which is produced in the pass band of the second filter and which is caused by the Rayleigh-wave spurious responses, may be reduced, so as to achieve a reduction of the insertion loss in the pass band of the second filter.

The first filter may further include a third serial arm resonator provided on the first path. The third serial arm resonator may include a piezoelectric substrate and an IDT electrode that use a leaky wave as a principal acoustic wave. The occurrence frequency of the Rayleigh wave response of the first serial arm resonator may be located outside the pass band of the second filter. The first serial arm resonator may be connected closest to the common terminal among the first serial arm resonator, the second serial arm resonator, and the third serial arm resonator.

In the configuration described above, the occurrence frequency of the Rayleigh wave response of the first serial arm resonator is located outside the pass band of the second filter. In addition, the first serial arm resonator is connected closer to the common terminal than the second serial arm resonator and the third serial arm resonator. Thus, this configuration described above achieves a smaller influence on the reflection coefficients from the Rayleigh wave responses of the second serial arm resonator and the third serial arm resonator. Accordingly, a ripple, which is produced in the pass band of the second filter and which is caused by the Rayleigh-wave spurious responses, may be reduced, so as to achieve a reduction of the insertion loss in the pass band of the second filter.

The first filter may further include a parallel arm resonator provided on a path connecting the first path to a ground. The first filter may include a ladder filter structure defined by the first serial arm resonator, the second serial arm resonator, and the parallel arm resonator.

Accordingly, the insertion loss in the pass band of the second filter is able to be reduced while low loss of the first filter is provided.

The first filter may further include a longitudinally coupled filter structure provided on the first path.

Accordingly, the insertion loss in the pass band of the second filter is able to be reduced while a high attenuation in the first filter is provided.

The pass band of the first filter may be a downstream frequency band of Band 41n of LTE (Long Term Evolution), and the pass band of the second filter may be a downstream frequency band of Band 1 of LTE.

When the pass band of the first filter is the band of Band 41n of LTE, and when the pass band of the second filter is the downstream frequency band of Band 1 of LTE, a ripple in the pass band of the second filter is easily increased. Thus, a serial arm resonator of the first filter, which is provided to satisfy the condition described above, may cause a reduction of the ripple effectively, achieving the insertion loss.

A multiplexer according to a preferred embodiment of the present invention includes a common terminal, a first terminal, a second terminal, a first filter, and a second filter. The first filter is located between the common terminal and the first terminal. The second filter is located between the common terminal and the second terminal and has a pass band whose frequency is lower than a pass band of the first filter. The first filter includes a serial-arm resonant circuit, a first parallel arm resonator, and a second parallel arm resonator. The serial-arm resonant circuit is provided on a first path connecting the common terminal to the first terminal. The first parallel arm resonator and the second parallel arm resonator are provided on paths connecting the first path to a ground. Each of the first parallel arm resonator and the second parallel arm resonator includes a piezoelectric substrate and an IDT electrode which use a leaky wave as a principal acoustic wave. An occurrence frequency of a Rayleigh wave response of the first parallel arm resonator is different from an occurrence frequency of a Rayleigh wave response of the second parallel arm resonator.

In a multiplexer having a configuration in which a first filter using leaky waves as principal acoustic waves is connected to a second filter through a common terminal, the Rayleigh wave response (Rayleigh-wave spurious response) of a parallel arm resonator included in the first filter is produced in the frequency range lower than the pass band of the first filter. In this case, the reflection coefficient in the lower frequency range, which is observed when the first filter is viewed from the common terminal, degrades (decreases). Thus, when the lower frequency range is included in the pass band of the second filter, a ripple caused by the Rayleigh wave response is produced in the pass band of the second filter. This ripple degrades the insertion loss in the pass band of the second filter.

In contrast, the configuration described above indicates that the occurrence frequency of the Rayleigh wave response of the first parallel arm resonator included in the first filter is different from that of the second parallel arm resonator, so as to achieve frequency-distribution of the Rayleigh wave responses produced in the frequency range lower than the pass band of the first filter. This avoids the occurrence of the state in which the Rayleigh wave responses, concentrated at a specific frequency, are produced by multiple parallel arm resonators and in which an accumulated response is produced, so as to achieve reduction of the magnitude of the Rayleigh-wave spurious response. Accordingly, the magnitude of a ripple, which is produced in the pass band of the second filter and which is caused by the Rayleigh-wave spurious response, may be reduced, so as to achieve a reduction of the insertion loss in the pass band of the second filter.

A radio-frequency front-end circuit according to a preferred embodiment of the present invention includes any of the multiplexers described above and an amplifying circuit that is connected to the multiplexer.

Thus, there may be provided a radio-frequency front-end circuit which achieves a reduction of the insertion loss in the pass band, which is located in a lower frequency range, of the second filter of the multiplexer in which the first filter and the second filter are connected to the common point.

A communication device according to a preferred embodiment of the present invention includes an RF signal processing circuit and the radio-frequency front-end circuit described above. The RF signal processing circuit processes a radio frequency signal received/transmitted through an antenna device. The radio-frequency front-end circuit transmits the radio frequency signal between the antenna device and the RF signal processing circuit.

Thus, there may be provided a communication device which achieves a reduction of the insertion loss in the pass band, which is located in a lower frequency range, of the second filter of the multiplexer in which the first filter and the second filter are connected to the common point.

The multiplexers, the radio-frequency front-end circuits, and the communication devices provided by the preferred embodiments of the present invention significantly reduce or prevent degradation of the insertion loss in the pass band which is caused by the Rayleigh wave responses of acoustic-wave resonators.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 7A to 7E include graphs showing filter characteristics of a first filter with respect to differences in wavelength $\lambda$ of a serial arm resonator in a multiplexer according to the first preferred embodiment of the present invention.

DETAILED DESCRIPTION OF THE PREFERRED EMBODIMENTS

Figure 1:
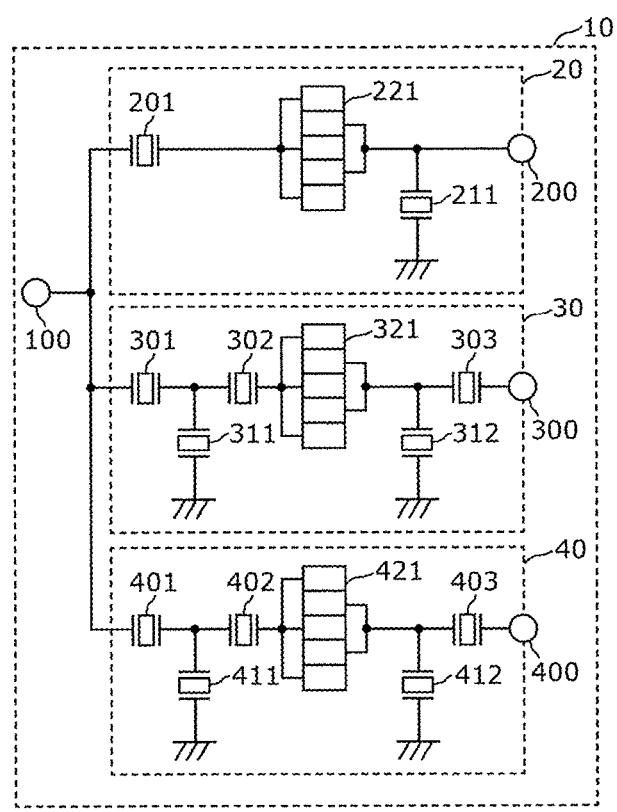
FIG. 1 is a circuit diagram showing a multiplexer according to a first preferred embodiment of the present invention.

Preferred embodiments of the present invention will be described in detail below with reference to the drawings. Each of the preferred embodiments described below indicates a comprehensive or concrete example. The values, shapes, materials, components, component arrangement and connection configurations, and the like, which are indicated by the preferred embodiments below, are exemplary, and are not intended to limit the present invention. Among components in the preferred embodiments below, components which are not described in the independent claims are described as optional components. The sizes or the ratios in size of the components shown in the drawings are not necessarily strict. In the figures, identical reference numerals are designated for the same or substantially the same configuration. Repeated description may be avoided or simplified. In the preferred embodiments below, "to connect" encompasses not only direct connection but also electrical connection through a different device and the like.

First Preferred Embodiment

1. Basic Configuration of a Multiplexer

FIG. 1 is a diagram showing the configuration of a multiplexer 10 according to a first preferred embodiment of the present invention. The multiplexer 10 is a triplexer (branching filter) which includes multiple filters (in this example, three filters 20, 30, and 40), whose pass bands are different from each other, and in which the antenna-side terminals of the filters are connected to a common terminal 100. Specifically, as shown in FIG. 1, the multiplexer 10 includes the common terminal 100, three individual terminals 200, 300, and 400, and the three filters 20, 30, and 40.

The common terminal 100 is provided for the three filters 20, 30, and 40 in common, and is connected to the filters 20, 30, and 40 in the multiplexer 10. In addition, the common terminal 100 is connected to an antenna (not shown) outside the multiplexer 10. That is, the common terminal 100 also defines and functions as an antenna terminal of the multiplexer 10.

The individual terminals 200, 300, and 400 are provided individually for the three filters 20, 30, and 40, respectively, and are connected to the respective filters in the multiplexer 10. In addition, the individual terminals 200, 300, and 400 are connected to an RF signal processing circuit (RFIC: Radio Frequency Integrated Circuit, not shown), for example, through an amplifying circuit (not shown) outside the multiplexer 10.

The filter 20 is provided on the path connecting the common terminal 100 to the individual terminal 200. In the first preferred embodiment, the filter 20 is preferably, for example, a receive filter whose pass band is the downstream frequency band (receive band: about 1805-about 1880 MHz) of Band 3 of LTE (Long Term Evolution).

The filter 40 is provided on a first path connecting the common terminal 100 to the individual terminal 400. In the first preferred embodiment, the filter 40 is preferably, for example, a filter whose pass band is a frequency band (about 2555-about 2655 MHz) of Band 41n of LTE. The filter 40 corresponds to a first filter located between the common terminal 100 and a first terminal (in this example, the individual terminal 400).

The filter 30 is provided on the path connecting the common terminal 100 to the individual terminal 300. In the first preferred embodiment, the filter 30 is preferably, for example, a receive filter whose pass band is the downstream frequency band (receive band: about 2110-about 2170 MHz) of Band 1 of LTE. The filter 30 corresponds to a second filter which is located between the common terminal 100 and a second terminal (in this example, the individual terminal 300) and which has a pass band whose frequency is lower than that of the filter 40.

The pass bands of the three filters 20, 30, and 40 are not limited to the combination of Band 3, Band 1, and Band 41n. In addition, the number of filters connected to the common terminal 100 may be any as long as it is equal to or greater than two. Further, the multiplexer 10 may include multiple transmit filters or multiple receive filters. Alternatively, the multiplexer 10 may include both of a transmit filter and a receive filter.

2. Basic Configuration of a Filter

The basic configuration of each of the filters 20, 30, and 40 is described below.

As shown in FIG. 1, the filter 40 includes serial arm resonators 401, 402, and 403, parallel arm resonators 411 and 412, and a longitudinally coupled resonator 421.

The serial arm resonator 401 (first serial arm resonator), the serial arm resonator 402 (second serial arm resonator), the longitudinally coupled resonator 421, and the serial arm resonator 403 (third serial arm resonator) are provided in series in this sequence from the common terminal 100 side on the first path (serial arm) connecting the common terminal 100 to the individual terminal 400. The parallel arm resonator 411 is provided on the path (parallel arm) connecting a connecting point between the serial arm resonators 401 and 402 to the ground. The parallel arm resonator 412 is provided on the path (parallel arm) connecting a connecting point between the longitudinally coupled resonator 421 and the serial arm resonator 403 to the ground.

The longitudinally coupled resonator 421 includes, for example, five IDT (InterDigital Transducer) electrodes located adjacent to each other in the acoustic-wave propagation direction. The number of IDT electrodes of the longitudinally coupled resonator may be any as long as it is equal to or greater than two.

The filter 40 defines a bandpass filter having a pass band of Band 41n, by using the longitudinally coupled configuration of the longitudinally coupled resonator 421, the serial arm resonators 401 to 403, and the parallel arm resonators 411 and 412.

As shown in FIG. 1, the filter 30 includes serial arm resonators 301, 302, and 303, parallel arm resonators 311 and 312, and a longitudinally coupled resonator 321. The connection configuration of the acoustic-wave resonators of the filter 30 is the same or substantially the same as that of the filter 40, and the connection relationship of the acoustic-wave resonators will not be described.

The filter 30 defines a bandpass filter having a pass band of Band 1, by using the longitudinally coupled configuration of the longitudinally coupled resonator 321, the serial arm resonators 301 to 303, and the parallel arm resonators 311 and 312.

As shown in FIG. 1, the filter 20 includes a serial arm resonator 201, a parallel arm resonator 211, and a longitudinally coupled resonator 221. The serial arm resonator 201 and the longitudinally coupled resonator 221 are provided in series in this sequence from the common terminal 100 side on the path (serial arm) connecting the common terminal 100 to the individual terminal 200. The parallel arm resonator 211 is provided on the path (parallel arm) connecting a connecting point between the longitudinally coupled resonator 221 and the individual terminal 200 to the ground.

The filter 20 defines a bandpass filter having a pass band of Band 3, by using the longitudinally coupled configuration of the longitudinally coupled resonator 221, the serial arm resonator 201, and the parallel arm resonator 211.

In the filters 20, 30, and 40 described above, the longitudinally coupled resonators 221, 321, and 421 are not necessarily included. Instead of the longitudinally coupled resonators 221, 321, and 421, ladder resonators including serial arm resonators and parallel arm resonators may be provided. For example, a longitudinally coupled resonator is preferable, for example, to achieve a high attenuation outside the pass band, and a ladder resonator is preferable, for example, to achieve low loss in the pass band.

The filter 40 may include at least two of the serial arm resonators 401 to 403, and the number of parallel arm resonators may be any number.

The filters 20 and 30 do not necessarily include acoustic-wave resonators. For example, an LC resonant filter, a dielectric filter, or the like may be included.

3. Basic Structure of a Resonator

The basic structure of each of the resonators (the serial arm resonators, the parallel arm resonators, and the longitudinally coupled resonator) included in the filter 40 (first filter) is described below. In the first preferred embodiment, the resonators are preferably surface acoustic wave (SAW: Surface Acoustic Wave) resonators.

Figure 2:
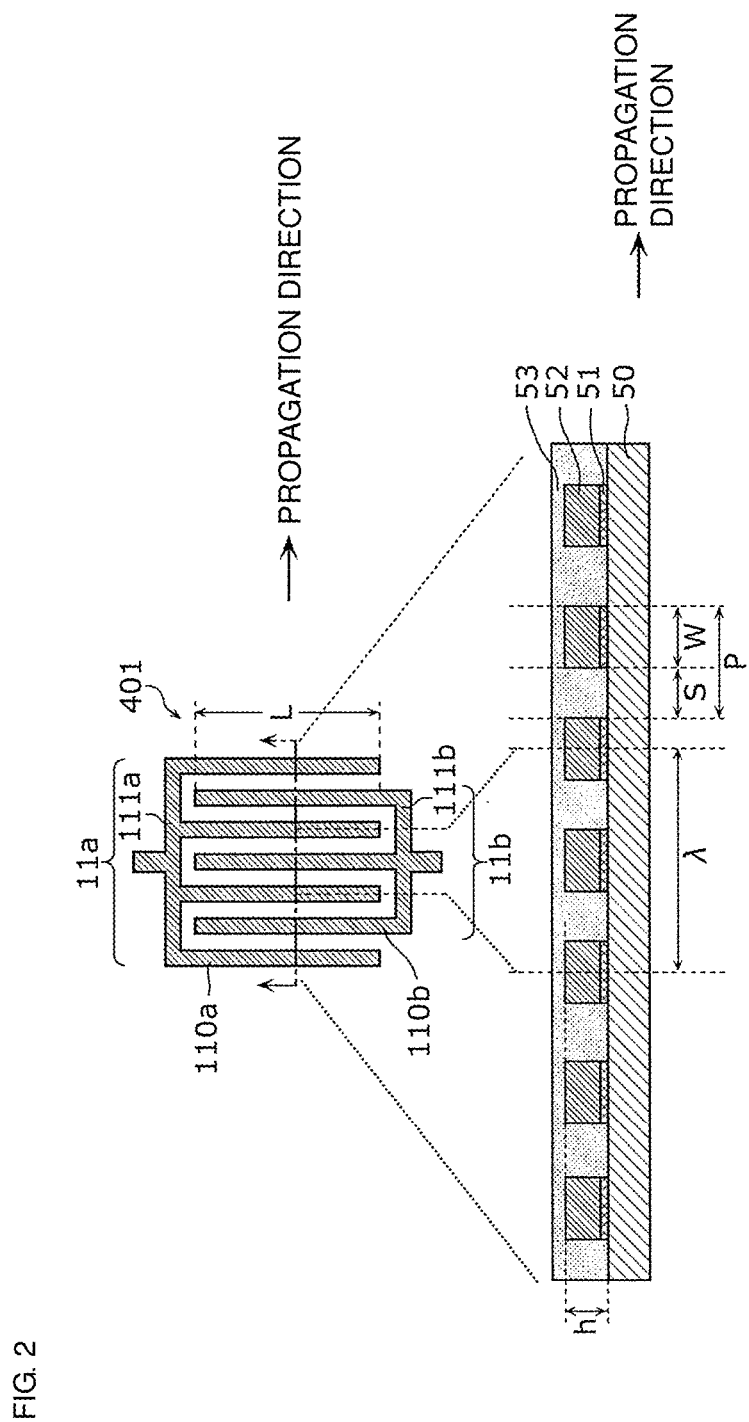
FIG. 2 includes a plan view and a sectional view which show a resonator in a filter according to the first preferred embodiment of the present invention.

FIG. 2 includes a plan view and a sectional view which show a resonator of the filter 40 according to the first preferred embodiment. FIG. 2 shows a plan view and a sectional view of the structure of the serial arm resonator 401 among the multiple resonators included in the filter 40. The serial arm resonator 401 shown in FIG. 2 shows a typical structure of the multiple resonators described above. The number, the length, and the like of electrode fingers included in the electrode are not limited to these.

As shown in the plan view in FIG. 2, the serial arm resonator 401 includes a pair of comb-shaped electrodes 11a and 11b facing each other. The serial arm resonator 401 further includes reflectors (not shown) located adjacent to the pair of comb-shaped electrodes 11a and 11b in the acoustic-wave propagation direction. The pair of comb-shaped electrodes 11a and 11b define an IDT electrode.

The comb-shaped electrode 11a is shaped like a comb, and includes multiple electrode fingers 110a parallel or substantially parallel to each other and a busbar electrode 111a connecting first ends of the electrode finger 110a to each other. The comb-shaped electrode 1ib is shaped like a comb, and includes multiple electrode fingers 110b parallel or substantially parallel to each other and a busbar electrode 111b connecting first ends of the electrode fingers 110b to each other. The multiple electrode fingers 110a and 110b extend in the orthogonal direction of the acoustic-wave propagation direction.

The configuration of the comb-shaped electrodes 11a and 11b is not limited to the configuration described above. For example, offset electrode fingers may be included. Further, the serial arm resonator 401 may include an inclined IDT in which the busbar electrodes 111a and 111b incline relative to the acoustic-wave propagation direction. Furthermore, thinned electrodes which indicate electrode fingers 110a and 110b thinned at predetermined intervals may be included.

The IDT electrode including the multiple electrode fingers 110a and 110b and the busbar electrodes 111a and 111b has a multilayer structure including an adhesive layer 51 and a principal electrode layer 52 as shown in the sectional view in FIG. 2.

The adhesive layer 51 is a layer that significantly improves adhesiveness between a piezoelectric substrate 50 and the principal electrode layer 52. For example, Ti is preferably used as the material of the adhesive layer 51. The film thickness of the adhesive layer 51 is preferably, for example, about 12 nm.

For example, Al including about 1% of Cu is preferably used as the material of the principal electrode layer 52. The film thickness of the principal electrode layer 52 is preferably, for example, about 162 nm.

A protective layer 53 covers the IDT electrode. The protective layer 53 is a layer, for example, that protects the principal electrode layer 52 from the external environment, adjusts frequency temperature characteristics, and significantly improves moisture resistance. The protective layer 53 is preferably, for example, a film which mainly includes silicon dioxide. The film thickness of the protective layer 53 is preferably, for example, about 25 nm.

The materials of the adhesive layer 51, the principal electrode layer 52, and the protective layer 53 are not limited to the materials described above. Further, the IDT electrode does not necessarily have the multilayer structure described above. The IDT electrode may be made of a metal, for example, Ti, Al, Cu, Pt, Au, Ag, or Pd, or an alloy of these, or may include multiple multilayer bodies of the metals described above or their alloy. The protective layer 53 is not necessarily provided.

An IDT electrode and reflectors are provided on the principal surface of the piezoelectric substrate 50. The piezoelectric substrate 50 is preferably made of, for example, 42° Y-cut X-propagating $LiTaO_3$ piezoelectric single crystal or piezoelectric ceramic (lithium tantalate single crystal or ceramic which is cut along a face whose normal matches an axis rotated by 42° from the Y-axis around the X-axis as the central axis, and in which surface acoustic waves propagate in the X-axis direction).

The filter 40 has a configuration in which the serial arm resonators 402 and 403, the parallel arm resonators 411 and 412, and the longitudinally coupled resonator 421 as well as the serial arm resonator 401 are provided of the IDT electrode and the piezoelectric substrate 50 described above, and defines a filter using leaky waves as principal acoustic waves.

The piezoelectric substrate 50 included in the filter 40 may be a piezoelectric substrate having a multilayer structure in which a high-acoustic-velocity support substrate, a low-acoustic-velocity film, and a piezoelectric film are laminated in this order. The piezoelectric film is preferably made of, for example, a 42° Y-cut X-propagating $LiTaO_3$ piezoelectric single crystal or piezoelectric ceramic. The piezoelectric film preferably has a thickness, for example, of about 600 nm. The high-acoustic-velocity support substrate is a substrate which supports the low-acoustic-velocity film, the piezoelectric film, and the IDT electrode. Further, the high-acoustic-velocity support substrate is a substrate in which the acoustic velocity of bulk waves is higher than that of acoustic waves, for example, as surface acoustic waves and boundary waves, propagating in the piezoelectric film. The high-acoustic-velocity support substrate confines surface acoustic waves in the multilayer portion of the piezoelectric film and the low-acoustic-velocity film, and significantly reduces or prevents leaking of surface acoustic waves downward from the high-acoustic-velocity support substrate. The high-acoustic-velocity support substrate is preferably, for example, a silicon substrate, and its thickness is preferably, for example, about 200 µm. The low-acoustic-velocity film is a film in which the acoustic velocity of bulk waves is lower than that of bulk waves propagating in the piezoelectric film. The low-acoustic-velocity film is located between the piezoelectric film and the high-acoustic-velocity support substrate. This structure and a property of acoustic waves, indicating that their energy naturally concentrates into a low-acoustic-velocity medium, significantly reduce or prevent leakage of surface acoustic wave energy to the IDT electrode exterior. The low-acoustic-velocity film is preferably, for example, a film which mainly includes silicon dioxide, and its thickness is preferably, for example, about 670 nm. Compared with a single-layer structure of the piezoelectric substrate 50, the multilayer structure is able to significantly improve the Q values at the resonant frequency and the anti-resonant frequency. That is, since a surface acoustic wave resonator having a high Q value may be provided, use of the surface acoustic wave resonator is able to provide a filter having a low insertion loss.

The high-acoustic-velocity support substrate may have a multilayer structure including a support substrate and a high-acoustic-velocity film in which the acoustic velocity of propagating bulk waves is higher than that of acoustic waves, for example, surface acoustic waves and boundary waves, propagating in the piezoelectric film. In this case, as the support substrate, for example, a dielectric material or a semiconductor, such as silicon or gallium nitride, and a resin substrate may preferably be used. Examples of a dielectric material include sapphire, a piezoelectric body, such as lithium tantalate, lithium niobate, or quartz crystal, various types of ceramic, such as alumina, magnesia, silicon nitride, aluminum nitride, silicon carbide, zirconia, cordierite, mullite, steatite, and forsterite, and glass. As the high-acoustic-velocity film, various high acoustic velocity materials may preferably be used, such as, for example, aluminum nitride, aluminum oxide, silicon carbide, silicon nitride, silicon oxynitride, a DLC film, or diamond, a medium which mainly includes one of those materials, and a medium which mainly includes a mixture of those materials.

Electrode parameters of the IDT electrode included in the surface acoustic wave resonator are described below.

The wavelength of the surface acoustic wave resonator is determined by the wavelength λ which indicates a repeated period of the electrode fingers 110a or 110b included in the IDT electrode in FIG. 2. The electrode pitch P is half the wavelength λ. When the line width of each of the electrode fingers 110a and 110b included in the comb-shaped electrodes 11a and 11b is represented by W, and when the space width between an electrode finger 110a and an electrode finger 110b, which are adjacent to each other, is represented by S, the electrode pitch P is defined as (W+S). The intersecting width L of a pair of the comb-shaped electrodes 11a and 11b is the length of the overlapping portion of electrode fingers which is obtained when viewed in the propagation direction. The electrode duty R of each resonator indicates an occupation rate of the line width of the electrode fingers 110a and 110b. The electrode duty R is a ratio of the line width of the electrode fingers 110a and 110b with respect to the value of addition of the line width to the space width, and is defined as W/(W+S).

4. Influence of Rayleigh-Wave Spurious Responses

An influence of Rayleigh-wave spurious responses exerted in the filter using leaky waves as principal acoustic waves is described below.

Figure 3A:
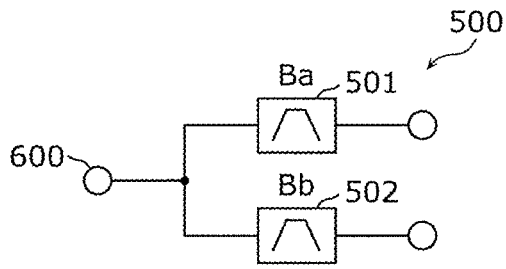
FIG. 3A is a diagram showing the block configuration of a multiplexer.

FIG. 3A is a diagram showing the block configuration of a multiplexer 500. FIG. 3A shows a view of the typical multiplexer 500. The multiplexer 500 has a configuration in which a filter 501 using Band Ba and a filter 502 using Band Bb are connected to a common terminal 600. Band Ba is assigned to a lower frequency range than Band Bb. That is, the pass band of the filter 501 is positioned in a lower frequency range than the pass band of the filter 502. The filter 502 is a surface-acoustic-wave filter using leaky waves as principal acoustic waves.

Figure 3B:
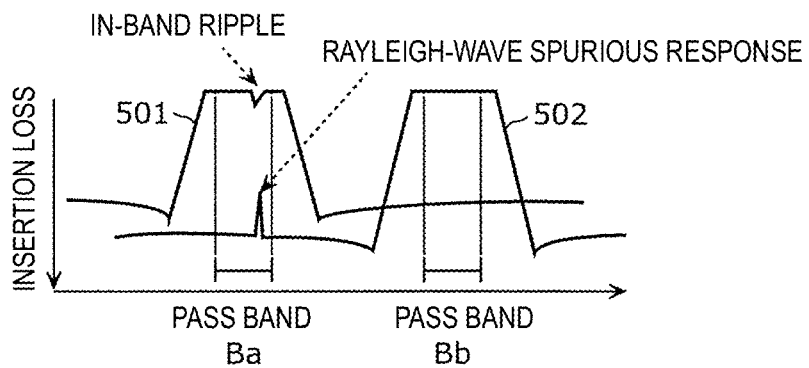
FIG. 3B is a diagram showing degradation of the insertion loss of a multiplexer of the related art.

FIG. 3B is a diagram showing degradation of the insertion loss of the multiplexer 500 of the related art. As described above, the filter 502 is a surface-acoustic-wave filter using leaky waves as principal acoustic waves. Thus, Rayleigh wave responses (Rayleigh-wave spurious responses) are produced in the lower frequency range than the pass band of the filter 502. At the frequency at which the Rayleigh wave responses are produced, the reflection coefficient, which is observed when the filter 502 is viewed from the common terminal 600, degrades (decreases). Due to this, when the frequency at which the Rayleigh wave responses are produced is included in the pass band of the filter 501, as shown in FIG. 3B, a ripple caused by the Rayleigh wave responses is produced in the pass band of the filter 501. The ripple produced in the pass band causes the insertion loss in the pass band of the filter 501 to degrade.

Figure 4:
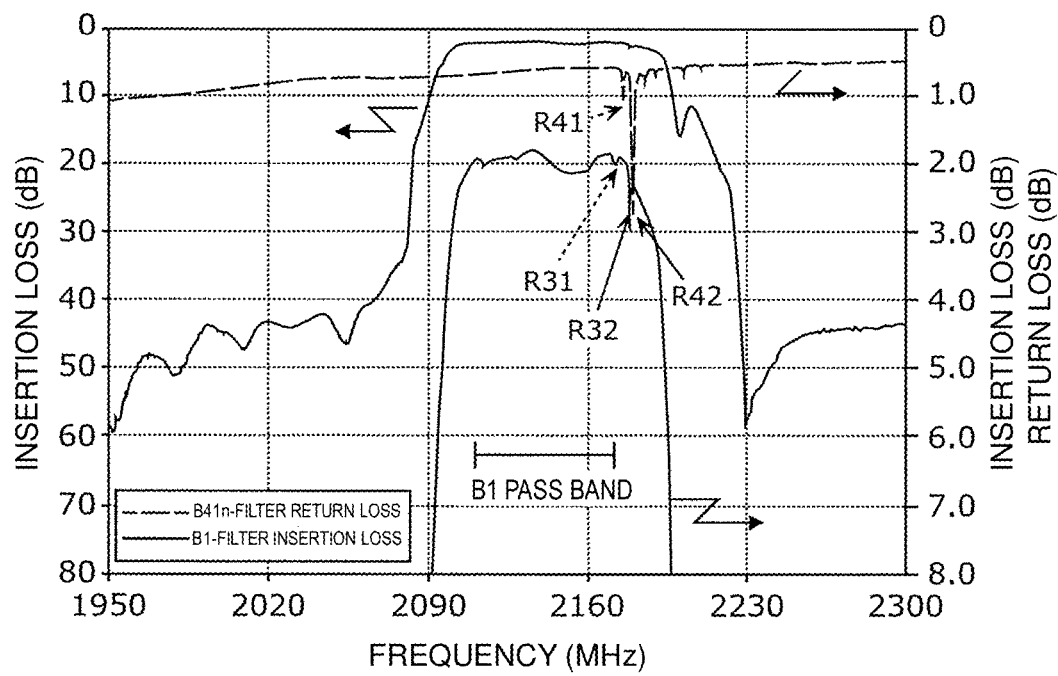
FIG. 4 is a graph showing degradation of the insertion loss of a Band-1 filter in a multiplexer in which a Band-41n filter and the Band-1 filter are connected to a common point.

FIG. 4 is a graph showing degradation of the insertion loss of a Band-1 filter due to Rayleigh wave responses of a Band-41n filter in a multiplexer in which the Band-41n filter and the Band-1 filter are connected to a common point. The Band-41n filter in FIG. 4 has the same or substantially the same resonator connection configuration as the filter 40 in FIG. 1. The Band-1 filter in FIG. 4 has the same or substantially the same resonator connection configuration as the filter 30 in FIG. 1. The wavelengths λ of the three serial arm resonators 401, 402, and 403 of the Band-41n filter are the same or substantially the same. The Rayleigh wave responses of the three serial arm resonators 401, 402, and 403 are concentrated at the high end of the Band-1 pass band.

Figure 5:
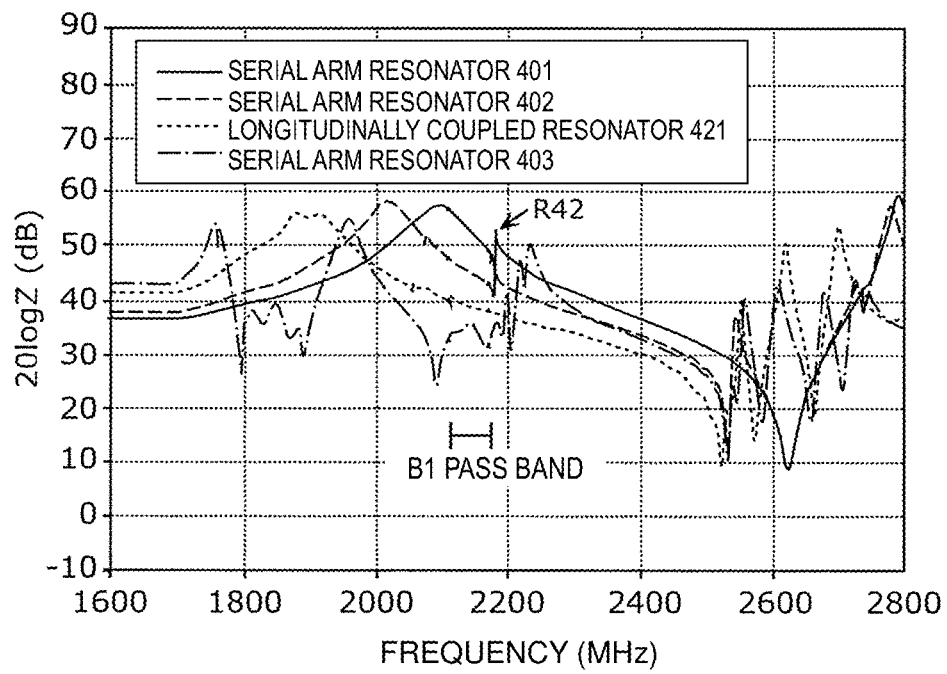
FIG. 5 is a graph showing impedance characteristics of the acoustic-wave resonators of a Band-41n filter in a multiplexer in which the Band-41n filter and a Band-1 filter are connected to a common point.

FIG. 5 is a graph showing impedance characteristics of each acoustic-wave resonator of the Band-41n filter in the multiplexer in which the Band-41n filter and the Band-1 filter are connected to a common point. The impedance characteristics of each resonator shown in FIG. 5 are obtained by analyzing reflection characteristics observed when the Band-41n filter is viewed from the common terminal 100. FIG. 5 shows the following points. An inflection point (maximum point) of impedance appears at the high end of the Band-1 pass band. Especially, the impedance inflection point of the serial arm resonator 401 connected closest to the common terminal 100 appears conspicuously. A resonator farther from the common terminal 100 has a smaller impedance inflection point. Thus, in FIG. 5, it is determined that the maximum point R42 of the return loss of the Band-41n filter is caused due to the fact that the occurrence frequency of the Rayleigh wave response of the serial arm resonator 401 matches that of the serial arm resonator 402. It is discovered that, at this frequency, a large ripple (R32) of the Band-1 filter appears and the insertion loss of the Band-1 filter degrades.

From the result obtained through diligent study, the inventor of preferred embodiments of the present invention has discovered that the factor of degradation of the insertion loss of the filter 501 (Band-1 filter) is the Rayleigh wave responses described above, and that the configuration described below may be applied to significantly reduce or prevent degradation of the insertion loss of the filter 501 (Band-1 filter).

Figure 3C:
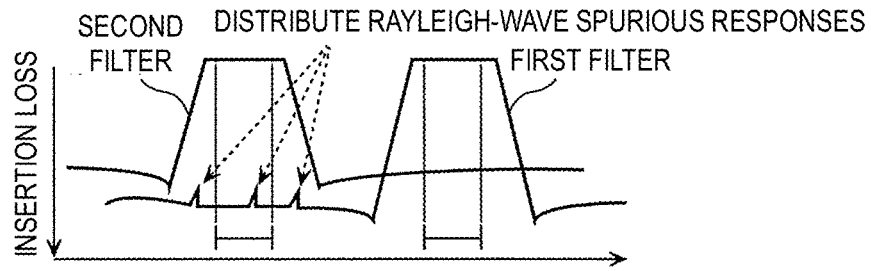
FIG. 3C is a diagram showing a configuration that significantly reduces or prevents degradation of the insertion loss of a multiplexer according to a preferred embodiment of the present invention example.

FIG. 3C is a diagram showing a configuration that significantly reduces or prevents degradation of the insertion loss of the multiplexer 10 according to an example of the first preferred embodiment. In the multiplexer 10 according to the example, in order to reduce the magnitude of the Rayleigh-wave spurious response described above, the occurrence frequencies of the Rayleigh wave responses of the serial arm resonators included in the first filter are made different. Accordingly, the Rayleigh wave responses, which are produced in the frequency range lower than the pass band of the first filter, are able to be frequency-distributed. Accordingly, the occurrence of the state in which the Rayleigh wave responses are produced in the serial arm resonators included in the first filter is able to be significantly reduced or prevented from being concentrated at a specific frequency, so as to achieve a reduction of the magnitude of the Rayleigh-wave spurious response. Thus, the magnitude of the ripple, which is caused by the Rayleigh wave response and which is produced in the pass band of the second filter, may be reduced, so as to achieve a reduction of the insertion loss in the pass band of the second filter.

Figure 3D:
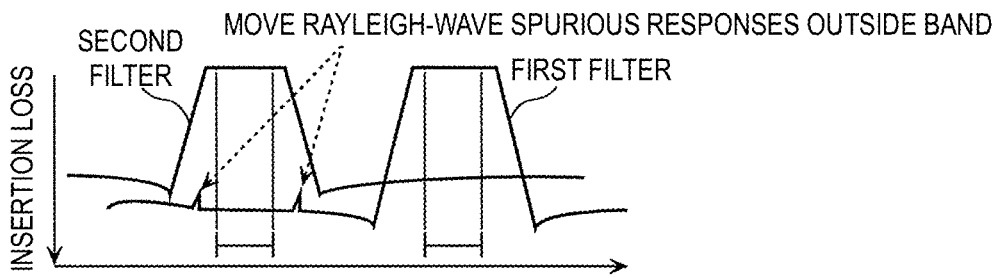
FIG. 3D is a diagram showing a configuration that significantly reduces or prevents degradation of the insertion loss of a multiplexer according to a modified example.

FIG. 3D is a diagram showing a configuration that significantly reduces or prevents degradation of the insertion loss of the multiplexer 10 according to a modified example of the first preferred embodiment. In the multiplexer 10 according to the modified example, to avoid the influence of the Rayleigh-wave spurious responses on the second filter, the occurrence frequencies of the Rayleigh wave responses of the serial arm resonators included in the first filter are made to be located outside the pass band of the second filter. Thus, occurrence of the Rayleigh-wave spurious responses in the pass band of the second filter may be eliminated, so as to achieve a reduction of the insertion loss in the pass band of the second filter.

5. Multiplexer According to Example of Preferred Embodiment

Table 1 indicates the IDT electrode parameters (the wavelength λ, the number N of pairs, the intersecting width L, and the electrode duty R) of the B41n filters of multiplexers according to the example and a comparison example.

As shown in Table 1, in the multiplexer according to the comparison example, the wavelengths λ of the serial arm resonators 401, 402, and 403 included in the Band-41n filter are the same or substantially the same. The state in which the wavelengths λ of multiple serial arm resonators are the same or substantially the same is defined as the state in which the difference between the wavelengths λ of the serial arm resonators (the difference between the maximum λ and the minimum λ) is equal to or less than about 0.5%. In this case, the resonant frequencies of the serial arm resonators 401, 402, and 403 match or substantially match each other, and the occurrence frequencies of the Rayleigh wave responses also match or substantially match each other.

In contrast, in the multiplexer 10 according to the example, the difference between the wavelengths λ of the serial arm resonators 401, 402, and 403 included in the Band-41n filter (filter 40) (the difference between the maximum λ and the minimum λ) is set to about 2%. More specifically, the wavelengths λ of the serial arm resonators 401 and 403 are made smaller by about 2% and about 1.8%, respectively, with respect to those according to the comparison example. Thus, the occurrence frequencies of the Rayleigh wave responses of the serial arm resonators 401 and 403 are made to be located outside the pass band of the Band-1 filter (filter 30) (in the frequency range higher than the pass band).

Figure 6:
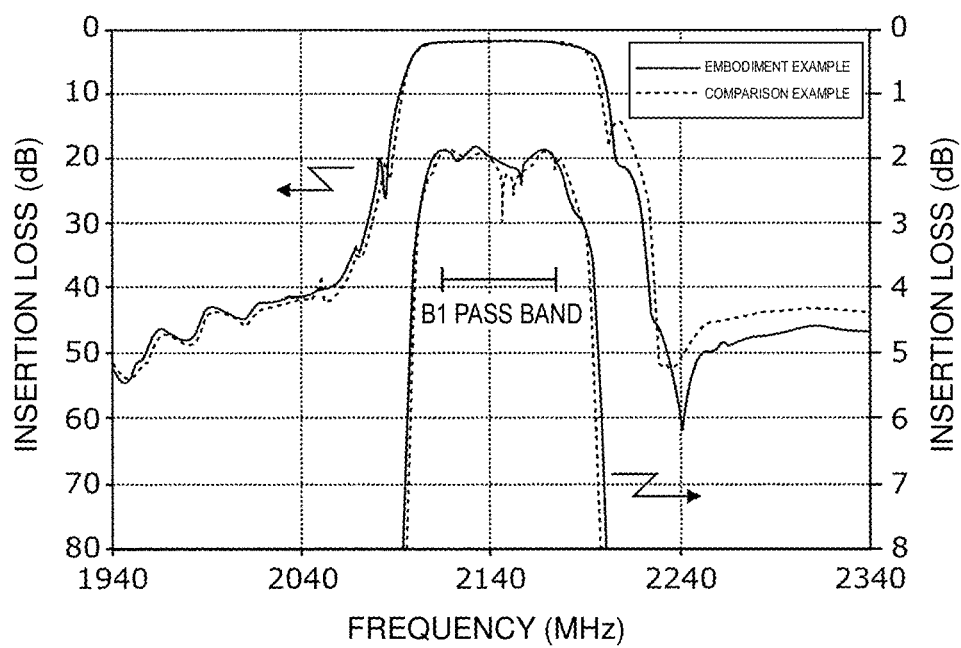
FIG. 6 is a graph in which bandpass characteristics of a Band-1 filter in a multiplexer according to an example of a preferred embodiment of the present invention are compared with those according to a comparison example.

FIG. 6 is a graph that compares the bandpass characteristics of the Band-1 filter of the multiplexer 10 according to the example with that of the multiplexer according to the comparison example. As shown in FIG. 6, in the Band-1 filter of the multiplexer according to the comparison example, the wavelengths λ of the serial arm resonators 401, 402, and 403 of the Band-41n filter are the same or substantially the same, causing occurrence of a large ripple at about the center of the Band-1 pass band. As described

TABLE 1

|  | Serial arm resonator 401 | Parallel arm resonator 411 | Serial arm resonator 402 | Parallel arm resonator 412 | Serial arm resonator 403 |
| --- | --- | --- | --- | --- | --- |
| Preferred embodiment example |  |  |  |  |  |
| IDT wavelength λ (μm) | 1.420 | 1.514 | 1.448 | 1.547 | 1.423 |
| IDT wavelength λ (ratio) | 1.000 | — | 1.020 | — | 1.002 |
| The number N of pairs (pairs) | 173 | 42 | 88 | 64 | 144.5 |
| Intersecting width L (μm) | 51.1 | 40.1 | 25.0 | 42.1 | 82.7 |
| Electrode duty R (%) | 59.8 | 59.8 | 59.8 | 59.8 | 59.8 |
| Comparison example |  |  |  |  |  |
| IDT wavelength λ (μm) | 1.452 | 1.518 | 1.449 | 1.550 | 1.450 |
| IDT wavelength λ (ratio) | 1.002 | — | 1.000 | — | 1.001 |
| The number N of pairs (pairs) | 174 | 41.5 | 88 | 71 | 138.5 |
| Intersecting width L (μm) | 39.2 | 23.4 | 49.7 | 40.0 | 104.1 |
| Electrode duty R (%) | 59.8 | 59.8 | 59.8 | 59.8 | 59.8 |

Table 1 describes only the IDT electrode parameters of the Band-41n filters. The Band-1 filters and the Band-3 filters use the same IDT electrode parameters in the multiplexers according to the example and the comparison example. Thus, its description is skipped.

above, this occurs due to the state in which the Rayleigh wave responses, which match or substantially match each other, of the serial arm resonators 401, 402, and 403 are located at about the center of the pass band of the Band-1 filter.

In contrast, in the Band-1 filter (filter 30) of the multiplexer 10 according to the example, the Rayleigh wave responses of the serial arm resonators 401 and 403 of the Band-41n filter (filter 40) do not match the Rayleigh wave response of the serial arm resonator 402. That is, the Rayleigh-wave spurious responses of the serial arm resonators 401, 402, and 403 are frequency-distributed. Further, the Rayleigh wave responses of the serial arm resonators 401 and 403 are located outside the pass band of Band 1. Accordingly, as shown in FIG. 6, a ripple due to only the Rayleigh wave response of the serial arm resonator 402 is observed in the Band-1 pass band. However, the ripple is smaller than the ripple of the Band-1 filter according to the comparison example. Thus, compared with the multiplexer according to the comparison example, the multiplexer 10 according to the example may significantly reduce or prevent degradation of the insertion loss in the pass band of the Band-1 filter (filter 30).

6. The Multiplexer According to the Modified Example

As shown in FIG. 3C, in the multiplexer 10 according to the example, the occurrence frequencies of the Rayleigh wave responses of the serial arm resonators included in the first filter are made different. Thus, the Rayleigh-wave spurious responses are frequency-distributed, and the ripple in the pass band of the second filter is reduced. In contrast, as shown in FIG. 3D, in the multiplexer according to the modified example, the occurrence frequencies of the Rayleigh wave responses of the serial arm resonators included in the first filter are made to be located outside the pass band of the second filter. Thus, the ripple in the pass band of the second filter is reduced.

In the multiplexer 10, the difference between the wavelength (first IDT wavelength) of the serial arm resonator 401 of the filter 40 (first filter) and the wavelength (second IDT wavelength) of the serial arm resonator 402 is made by $D\lambda$ (%). Assume that this case causes the occurrence of the frequency difference, which is DR (%) with respect to the center frequency of the filter 40 (first filter), between the occurrence frequency of the Rayleigh wave response of the serial arm resonator 401 and that of the serial arm resonator 402.

In this case, in the multiplexer 10 in which the band width ratio of the filter 30 (second filter) is X2(%), the difference $D\lambda x$ (%) between the first IDT wavelength and the second IDT wavelength with respect to the second IDT wavelength preferably, for example, satisfies Expression 1 described below.

$$D\lambda x(\%) \geq (X2/DR) \times D\lambda \qquad \text{(Expression 1)}$$

When the IDT wavelengths of serial arm resonators are adjusted, the occurrence frequencies of the Rayleigh wave responses in addition to the resonant frequencies of the serial arm resonators change. When the difference between the first IDT wavelength and the second IDT wavelength is made by $D\lambda$ (%) in the filter 40 (first filter), the frequency difference between the occurrence frequencies of the Rayleigh wave responses is DR (%). Thus, in the filter 30 (second filter) having a band width ratio of X2(%), to locate the Rayleigh wave responses outside the pass band of the filter 30 (second filter), the difference $D\lambda x$ (%) between the first IDT wavelength and the second IDT wavelength satisfies the relationship indicated by Expression 1 described above. Accordingly, the occurrence frequencies of the Rayleigh wave responses of the serial arm resonators are able to be located outside the pass band of the filter 30 (second filter). The Rayleigh-wave spurious responses in the pass band of the second filter may be eliminated, so as to achieve a reduction of the insertion loss in the pass band of the second filter.

In the example, assume the case where the IDT electrode parameters of the filter 40 (first filter) are set as described in Table 1 so that the difference between the first IDT wavelength and the second IDT wavelength with respect to the second IDT wavelength is made by about 2%. This case causes occurrence of the frequency difference, which is about 1.47% with respect to the center frequency of the filter 40 (first filter), between the occurrence frequency of the Rayleigh wave response of the serial arm resonator 401 and that of the serial arm resonator 402. That is, in Expression 1 described above, $D\lambda$=about 2% and DR=about 1.47%. In this example, the filter 30 (second filter) is a Band-1 filter, and the band width ratio X2 is about 2.93%.

Thus, by substituting $D\lambda$, DR, and X2, which are described above, into Expression 1, the difference $D\lambda x$ (%) between the first IDT wavelength and the second IDT wavelength with respect to the second IDT wavelength is derived as being equal to or greater than about 4%.

Accordingly, the occurrence frequencies of the Rayleigh wave responses of the serial arm resonator 401 and the serial arm resonator 402 are able to be located outside the pass band of the filter 30 (second filter). Thus, for example, the Rayleigh-wave spurious responses in the pass band, which are produced when the second filter is compatible with Band 1 of LTE having a band width ratio of about 2.93%, may be eliminated, so as to achieve a reduction of the insertion loss in the pass band of the second filter.

The example and the modified example show that, when the difference between the wavelengths $\lambda$ of the IDT electrodes of the serial arm resonators 401, 402, and 403 is equal to or greater than about 2% or equal to or greater than about 4%, the insertion loss in the pass band of the filter 30 (second filter) may be reduced. Now, the range of the difference between the wavelengths $\lambda$ of the serial arm resonators included in the filter 40 (first filter) is described below.

FIGS. 7A to 7E include graphs indicating filter characteristics of the filter 40 (first filter) with respect to the difference between the wavelengths $\lambda$ of serial arm resonators in the multiplexer 10 according to the first preferred embodiment. FIGS. 7A to 7E show the bandpass characteristics and the voltage standing wave ratio of the filter 40 (first filter) which are obtained when the wavelength $\lambda$ of the serial arm resonator 401 is changed in the range from about 2% to about 40% with respect to the wavelengths $\lambda$ of the serial arm resonators 402 and 403. FIG. 7A shows wideband bandpass characteristics of the filter 40 (first filter). FIG. 7B shows bandpass characteristics in and around the pass band of the filter 40 (first filter). FIG. 7C shows the voltage standing wave ratio (VSWR) of the filter 40 (first filter) at the common terminal 100. FIG. 7D shows the voltage standing wave ratio (VSWR) of the filter 40 (first filter) at the individual terminal 400. FIG. 7E shows bandpass characteristics in and around the pass band of the filter 40 (first filter) obtained after mismatching loss is removed.

As shown in FIGS. 7B and 7E, even when the wavelength $\lambda$ of the serial arm resonator 401 is changed in the range from about 2% to about 40%, the insertion loss in the pass band of the filter 40 (first filter) does not change significantly. As shown in FIGS. 7C and 7D, as the wavelength $\lambda$ of the serial arm resonator 401 changes from about 2% to about 40%, the voltage standing wave ratio (VSWR) increases. However, the voltage standing wave ratio (VSWR) remains under two, indicating that it is in an excellent range. As shown in FIG. 7A, also in the attenuation band of the filter 40 (first filter), the attenuation remains excellent.

As described above, when, among the serial arm resonators included in the filter 40 (first filter), the wavelength λ of the serial arm resonator 401 which is closest to the common terminal 100 is changed from about 2% to about 40%, inclusive, with respect to the wavelengths λ of the other serial arm resonators, the bandpass characteristics of the filter 40 (first filter) may remain excellent, and, at the same time, the insertion loss in the pass band of the filter 30 (second filter) may be reduced.

In the multiplexer 10 of the example, among the three or more serial arm resonators included in the filter 40 (first filter), the occurrence frequency of the Rayleigh wave response of the serial arm resonator 401 which is connected closest to the common terminal 100 may be different from the occurrence frequencies of the Rayleigh wave responses of the other serial arm resonators.

Accordingly, the reflection coefficient at the occurrence frequency of the Rayleigh wave response of the serial arm resonator 401 are able to be made larger than the reflection coefficients at the occurrence frequencies of the Rayleigh wave responses of the other serial arm resonators. Further, the serial arm resonator 401 is connected closer to the common terminal 100 than the other serial arm resonators. Thus, the reflection coefficients at the occurrence frequencies of the other serial arm resonators may be made relatively larger. Accordingly, a ripple due to the Rayleigh wave responses in the pass band of the filter (second filter) may be reduced, achieving reduction of the insertion loss in the pass band of the filter 30 (second filter).

In addition, in the multiplexer 10 according to the example, among the three or more serial arm resonators included in the filter 40 (first filter), the occurrence frequency of the Rayleigh wave response of the serial arm resonator 401 connected closest to the common terminal 100 may be located outside the pass band of the filter 30 (second filter).

According to the configuration described above, the occurrence frequency of the Rayleigh wave response of the serial arm resonator 401 is located outside the pass band of the filter (second filter), and the serial arm resonator 401 is connected closer to the common terminal 100 than the other serial arm resonators. Thus, the influence of the Rayleigh wave responses of the other serial arm resonators on the reflection coefficients may be made small. Accordingly, a ripple due to the Rayleigh wave response in the pass band of the filter 30 (second filter) may be reduced, so as to achieve a reduction of the insertion loss in the pass band of the filter 30 (second filter).

At that time, as in the example, the occurrence frequency of the Rayleigh wave response of the serial arm resonator 403 is not necessarily located outside the pass band of the filter 30 (second filter).

Second Preferred Embodiment

The multiplexer according to the first preferred embodiment may be applied to a radio-frequency front-end circuit and further to a communication device including the radio-frequency front-end circuit. In a second preferred embodiment of the present invention, such a radio-frequency front-end circuit and such a communication device are described.

Figure 8:
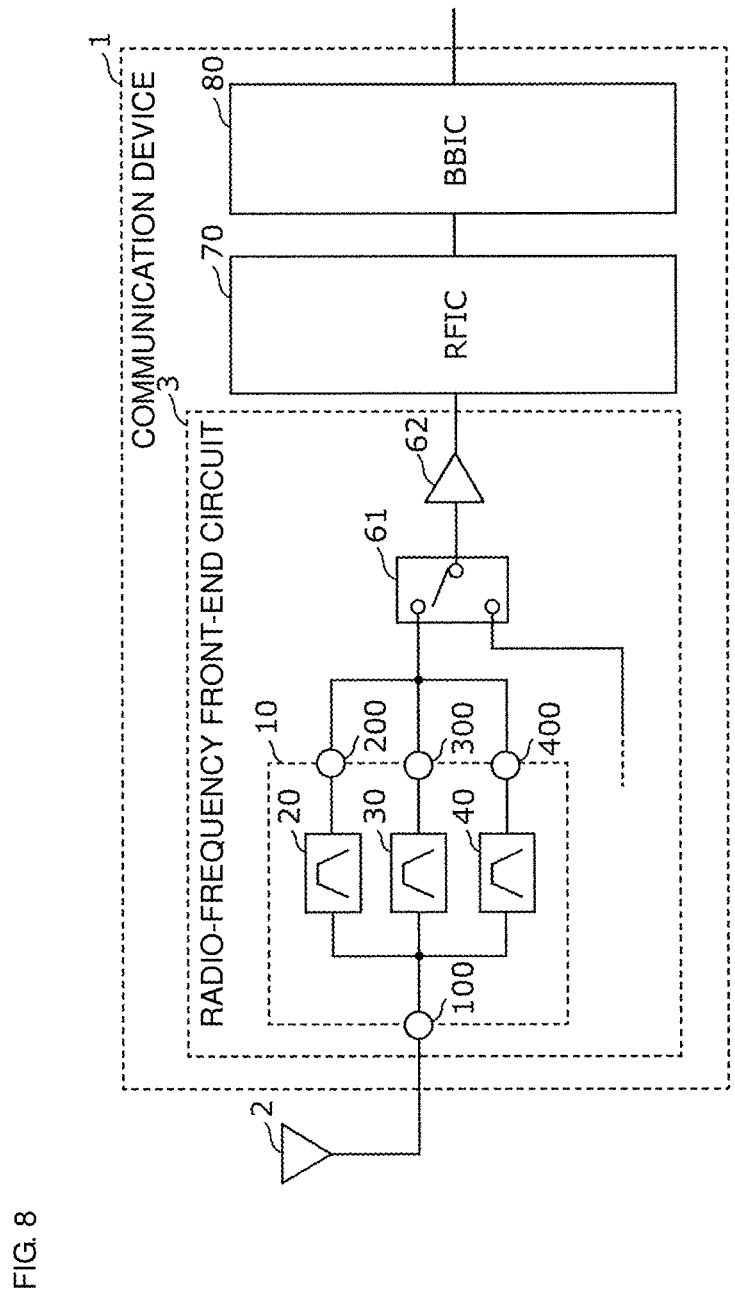
FIG. 8 is a diagram showing a configuration of a radio-frequency front-end circuit and a communication device according to a second preferred embodiment of the present invention.

FIG. 8 is a diagram showing the configuration of a radio-frequency front-end circuit 3 and a communication device 1 according to the second preferred embodiment. FIG. 8 also shows components (an antenna device 2, an RF signal processing circuit (RFIC) 70, and a baseband signal processing circuit (BBIC) 80) connected to the radio-frequency front-end circuit 3. The radio-frequency front-end circuit 3, the RF signal processing circuit 70, and the baseband signal processing circuit 80 define the communication device 1.

The radio-frequency front-end circuit 3 includes the multiplexer 10 according to the first preferred embodiment, a switch 61, and a low noise amplifier circuit 62.

The switch 61 is a switching circuit having a selective terminal connected to the individual terminals 200, 300, and 400 of the multiplexer 10, a selective terminal connected to a different signal path through which a radio frequency signal having a frequency band different from the pass bands of the filters 20, 30, and 40 passes, and a common terminal connected to the low noise amplifier circuit 62.

The switch 61 is preferably, for example, a SPDT (Single Pole Double Throw) switch that connects the common terminal to the multiplexer 10 or the different signal path in accordance with a control signal from a controller (not shown). The number of selective terminals connected to the common terminal is not limited to one, and may be more than one. That is, the radio-frequency front-end circuit 3 may be compatible with carrier aggregation.

The low noise amplifier circuit 62 is a receive amplifying circuit that amplifies, for output to the RF signal processing circuit 70, a radio frequency signal (in this example, a radio-frequency receive signal), which has passed through the antenna device, the multiplexer 10 (or the different signal path), and the switch 61.

The RF signal processing circuit 70 performs signal processing, for example, down-converting, on a radio-frequency receive signal, which is received from the antenna device 2 through a receive signal path, and outputs the receive signal, which has been generated through the signal processing, to the baseband signal processing circuit 80. The RF signal processing circuit 70 is preferably, for example, an RFIC.

A signal, which has been processed by the baseband signal processing circuit 80, is used, for example, as an image signal for displaying an image, or as an audio signal for calling.

The radio-frequency front-end circuit 3 may include a different circuit device located between the components described above. The radio-frequency front-end circuit 3 does not necessarily include the different signal path. In this case, the switch 61 is not necessarily included.

The radio-frequency front-end circuit 3 and the communication device 1, which have the configuration described above, include the multiplexer 10 according to the first preferred embodiment (including the example and the modified example). Thus, the insertion loss in the pass band, which is located on the low frequency range, of the second filter may be reduced.

The communication device 1 does not necessarily include the baseband signal processing circuit 80 in accordance with the method of processing a radio frequency signal.

The radio-frequency front-end circuit 3 according to the second preferred embodiment has a configuration in which multiple receive filters are connected to a common terminal. Alternatively, a transmit filter may be also connected to the common terminal. Examples of this configuration include one in which multiple duplexers are connected to a common terminal.

Other Preferred Embodiments

The multiplexers, the radio-frequency front-end circuits, and the communication devices according to the preferred embodiments of the present invention are described with reference to the example and the modified example. The present invention encompasses different preferred embodiments which are obtained by combining any components in the preferred embodiments, the example, and the modified example with each other, a modified example which is obtained by making various changes, which may be conceived by those skilled in the art, on the preferred embodiments without departing from the gist of the present invention, and various devices incorporating the radio-frequency front-end circuit and the communication device which are provided by the present invention.

A triplexer is described above as an example of the multiplexer. The present invention may be applied, for example, to a multiplexer in which a common antenna terminal is used for two or more filters.

The configuration of the multiplexer is not limited to one in which receive filters are included. Only transmit filters or both receive filters and transmit filters may be included.

In the preferred embodiments described above, to frequency-distribute the Rayleigh wave responses of the first filter using leaky waves as principal acoustic waves, the wavelengths λ of the IDT electrodes included in the serial arm resonators are changed. In contrast, to frequency-distribute the Rayleigh wave responses of the first filter using leaky waves as principal acoustic waves, the wavelengths λ of the IDT electrodes included in the parallel arm resonators of the first filter may be changed.

That is, the multiplexers according to the preferred embodiments of the present invention include the common terminal 100, the individual terminals 300 and 400, the first filter located between the common terminal 100 and the individual terminal 400, and the second filter that is located between the common terminal 100 and the individual terminal 300 and that has a pass band whose frequency is lower than that of the first filter. The first filter includes a serial-arm resonant circuit (for example, the longitudinally coupled resonator 421) provided on the first path connecting the common terminal 100 to the individual terminal 400, and the parallel arm resonator 411 and the parallel arm resonator 412 which are provided on the paths connecting the first path to the ground. Each of the parallel arm resonators 411 and 412 is formed of a piezoelectric substrate and an IDT electrode which use leaky waves as principal acoustic waves. The occurrence frequency of the Rayleigh wave response of the parallel arm resonator 411 may be different from that of the parallel arm resonator 412.

In the multiplexer having a configuration in which the first filter using leaky waves as principal acoustic waves is connected to the second filter through the common terminal 100, the Rayleigh wave response (Rayleigh-wave spurious response) of the parallel arm resonator 411 included in the first filter is produced in the frequency range lower than the pass band of the first filter. In this case, the reflection coefficient at the lower frequency which is observed when the first filter is viewed from the common terminal 100 degrades (decreases). Thus, when the lower frequency is included in the pass band of the second filter, a ripple caused by the Rayleigh wave response is produced in the pass band of the second filter. This ripple causes degradation of the insertion loss in the pass band of the second filter.

In contrast, according to the configuration described above, the occurrence frequency of the Rayleigh wave response of the parallel arm resonator 411 included in the first filter is different from that of the parallel arm resonator 412, so as to achieve frequency-distribution of the Rayleigh wave responses produced in the frequency range lower than the pass band of the first filter. This avoids the occurrence of the state in which Rayleigh wave responses, concentrated at a specific frequency, are produced by parallel arm resonators and form an amplified response, so as to achieve a reduction of the magnitude of the Rayleigh-wave spurious response. Accordingly, the magnitude of a ripple, which is caused by the Rayleigh-wave spurious response and which is produced in the pass band of the second filter, may be reduced, so as to achieve a reduction of the insertion loss in the pass band of the second filter.

INDUSTRIAL APPLICABILITY

Preferred embodiments of the present invention may be applied widely to communication equipment, for example, a cellular phone, as a multiplexer, a front-end circuit, and a communication device which may be used in a multiband system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal, a first terminal, and a second terminal;
   a first filter that is located between the common terminal and the first terminal; and
   a second filter that is located between the common terminal and the second terminal and that has a pass band whose frequency is lower than a pass band of the first filter; wherein
   the first filter includes at least a first serial arm resonator and a second serial arm resonator which are provided on a first path connecting the common terminal to the first terminal;
   each of the first serial arm resonator and the second serial arm resonator includes a piezoelectric substrate and an IDT electrode which use a leaky wave as a principal acoustic wave; and
   an occurrence frequency of a Rayleigh wave response of the first serial arm resonator is different from an occurrence frequency of a Rayleigh wave response of the second serial arm resonator.

2. The multiplexer according to claim 1, wherein a first IDT wavelength is different from a second IDT wavelength by about 2% or greater of the second IDT wavelength, the first IDT wavelength being defined by a repeated pitch of a plurality of electrode fingers included in the IDT electrode of the first serial arm resonator, the second IDT wavelength being defined by a repeated pitch of a plurality of electrode fingers included in the IDT electrode of the second serial arm resonator.

3. The multiplexer according to claim 2, wherein
   a difference between the first IDT wavelength and the second IDT wavelength with respect to the second IDT wavelength is Dλ (%), a frequency difference, which is DR (%) with respect to a center frequency of the first filter, is provided between the occurrence frequency of the Rayleigh wave response of the first serial arm resonator and the occurrence frequency of the Rayleigh wave response of the second serial arm resonator; and
   in the multiplexer in which a band width ratio of the second filter is X2(%), a difference Dλx (%) between the first IDT wavelength and the second IDT wavelength with respect to the second IDT wavelength satisfies a relationship, $D\lambda x$ (%)$\geq$(X2/DR)$\times D\lambda$.

4. The multiplexer according to claim 3, wherein
when the difference between the first IDT wavelength and the second IDT wavelength with respect to the second IDT wavelength is made by about 2%, the frequency difference, which is about 1.47% with respect to the center frequency of the first filter, is provided between the occurrence frequency of the Rayleigh wave response of the first serial arm resonator and the occurrence frequency of the Rayleigh wave response of the second serial arm resonator; and
in the multiplexer in which the band width ratio of the second filter is about 2.93%, the difference between the first IDT wavelength and the second IDT wavelength with respect to the second IDT wavelength is equal to or greater than about 4%.

5. The multiplexer according to claim 1, wherein
the first filter further includes a third serial arm resonator provided on the first path;
the third serial arm resonator includes a piezoelectric substrate and an IDT electrode which use a leaky wave as a principal acoustic wave;
the occurrence frequency of the Rayleigh wave response of the first serial arm resonator is different from an occurrence frequency of a Rayleigh wave response of the third serial arm resonator; and
the first serial arm resonator is connected closest to the common terminal among the first serial arm resonator, the second serial arm resonator, and the third serial arm resonator.

6. The multiplexer according to claim 1, wherein
the first filter further includes a third serial arm resonator provided on the first path;
the third serial arm resonator includes a piezoelectric substrate and an IDT electrode that use a leaky wave as a principal acoustic wave;
the occurrence frequency of the Rayleigh wave response of the first serial arm resonator is located outside the pass band of the second filter; and
the first serial arm resonator is connected closest to the common terminal among the first serial arm resonator, the second serial arm resonator, and the third serial arm resonator.

7. The multiplexer according to claim 1, wherein
the first filter further includes a parallel arm resonator provided on a path connecting the first path to a ground; and
the first filter includes a ladder filter structure defined by the first serial arm resonator, the second serial arm resonator, and the parallel arm resonator.

8. The multiplexer according to claim 1, wherein the first filter further includes a longitudinally coupled filter structure provided on the first path.

9. The multiplexer according to claim 1, wherein the pass band of the first filter is a downstream frequency band of Band 41n of LTE (Long Term Evolution), and the pass band of the second filter is a downstream frequency band of Band 1 of LTE.

10. A multiplexer comprising:
a common terminal, a first terminal, and a second terminal;
a first filter that is located between the common terminal and the first terminal; and
a second filter that is located between the common terminal and the second terminal and that has a pass band whose frequency is lower than a pass band of the first filter; wherein
the first filter includes:
a serial-arm resonant circuit provided on a first path connecting the common terminal to the first terminal; and
a first parallel arm resonator and a second parallel arm resonator that are provided on paths connecting the first path to a ground;
each of the first parallel arm resonator and the second parallel arm resonator includes a piezoelectric substrate and an IDT electrode which use a leaky wave as a principal acoustic wave; and
an occurrence frequency of a Rayleigh wave response of the first parallel arm resonator is different from an occurrence frequency of a Rayleigh wave response of the second parallel arm resonator.

11. A radio-frequency front-end circuit comprising:
the multiplexer according to claim 1; and
an amplifying circuit that is connected to the multiplexer.

12. A communication device comprising:
an RF signal processing circuit that processes a radio frequency signal received/transmitted through an antenna device; and
the radio-frequency front-end circuit according to claim 11 that transmits the radio frequency signal between the antenna device and the RF signal processing circuit.

13. The multiplexer according to claim 1, further comprising a third filter located between the common terminal and a third terminal.

14. The multiplexer according to claim 13, wherein a pass band of the third filter is lower than the pass band of the second filter.

15. The multiplexer according to claim 13, wherein the pass band of the third filter is a downstream frequency band of Band 3 of LTE (Long Term Evolution).

16. The multiplexer according to claim 1, wherein the second filter includes three serial arm resonators, two parallel arm resonators, and a longitudinally coupled resonator.

17. The multiplexer according to claim 13, wherein the third filter includes a serial arm resonator, a parallel arm resonator, and a longitudinally coupled resonator.

* * * * *